United States Patent [19]

Anemogiannis et al.

[11] Patent Number: 5,349,260
[45] Date of Patent: Sep. 20, 1994

[54] TWO TRACK SURFACE WAVE ARRANGEMENT WITH IMPROVED SELECTION PROPERTY

[75] Inventors: Kimon Anemogiannis, Munich; Giuliano Visintini, Unterhaching, both of Fed. Rep. of Germany

[73] Assignee: Siemens Aktiengesellschaft, Munich, Fed. Rep. of Germany

[21] Appl. No.: 48,505

[22] Filed: Apr. 20, 1993

[30] Foreign Application Priority Data

Apr. 29, 1992 [DE] Fed. Rep. of Germany ....... 4214122

[51] Int. Cl.⁵ .......... H03H 9/25; H03H 9/64; H01L 41/04
[52] U.S. Cl. .......... 310/313 D; 310/313 R; 333/195; 333/151; 333/154; 333/194
[58] Field of Search .......... 310/313 R, 313 B, 313 D; 333/151, 154, 194, 195

[56] References Cited

U.S. PATENT DOCUMENTS

| | | | |
|---|---|---|---|
| 4,065,789 | 12/1977 | DeVries | 310/313 B |
| 4,247,836 | 1/1981 | Redwood | 333/195 |
| 4,468,642 | 8/1984 | Hikita | 310/313 D |

FOREIGN PATENT DOCUMENTS

| | | | |
|---|---|---|---|
| 0117311 | 7/1984 | Japan | 333/195 |
| 0043912 | 3/1985 | Japan | 333/195 |
| 4278707 | 10/1992 | Japan | 333/195 |

*Primary Examiner*—Thomas M. Dougherty
*Attorney, Agent, or Firm*—Hill, Steadman & Simpson

[57] ABSTRACT

A two track surface wave arrangement has improved selection property resulting from crosstalk signals of parasitic transmission paths within the arrangement being suppressed. What can be achieved with a displacement of the surface wave arrangement of one track relative to that of the other track by a dimension of nearly half a wavelength is that crosstalk signals mutually cancel on the basis of interference without affecting the useful signal.

6 Claims, 3 Drawing Sheets

TWO TRACK SURFACE WAVE ARRANGEMENT WITH IMPROVED SELECTION PROPERTY

BACKGROUND OF THE INVENTION

The present invention is directed to two track surface wave arrangements, wherein a part of such an arrangement forming a first track is the actual input and the second track is the actual output of the overall arrangement. The electrical input signal is converted into surface waves in that part forming the input, these surface waves being shaped according to prescribable transfer functions in the structures of the appertaining first track. This first track contains a coupling transducer that is electrically coupled to a coupling transducer of the second track, so that the processed signal of the first track is transferred into the second track. Electroacoustic conversion again occurs in the second track. The acoustic signal processed in the second track is converted into an electrical signal via output transducers and is available at the output terminal. Low-loss filters are realized according to this principle, these being particularly employed in mobile radiotelephone technology. Such arrangements are also employed as relatively broad-band filter or resonator arrangements. Such surface wave arrangements are highly selective.

A multistrip coupler for signal coupling of the two tracks to one another can also be employed instead of the two coupling transducers.

What such two track arrangements have in common is that the selectivity that can be inherently achieved can be relatively greatly reduced due to acoustic crosstalk from one or more structures of one track onto one or more structures of the other track.

SUMMARY OF THE INVENTION

It is an object of the present invention to provide measures by means of which such acoustic crosstalk can be eliminated in an extremely simple manner.

In general terms the present invention is a two track surface wave arrangement, whereby 2N transducer structures, N being a whole number, belonging to the input side are present in a first track A in a geometrical arrangement relative to one another prescribed by the design. Also, 2N transducer structures belonging to the output side are arranged in the second track B. Each of the transducer structures has a reference plane (wherein N is a whole number). Coupling is provided between the two tracks A, B. A first arrangement composed of the transducer structures of the first track A and a second arrangement composed of the transducer structures of the second track are positioned offset relative to one another parallel to the direction of the tracks A, B, being positioned offset by the dimension $x_0$ according to $$|[(x_{11'} - x_0)^2 + (y_{12})^2]^{\frac{1}{2}} - [(x_{22'} + x_0)^2 + (y_{12})^2]^{\frac{1}{2}}| = \frac{\lambda_0}{2};$$

$$\text{or} = (2N - 1)\frac{\lambda_0}{2};$$

where:

$x_{11'}$ and $x_{22'}$ are the respective spacings of the transducer structures of the first track and of the second track from one another, $y_{12}$ is the spacing of the two tracks A, B from one another, and $\lambda_0$ is the wavelength in the substrate material of the two track surface wave arrangement.

In advantageous developments of the present invention the offset $x_0$ is also present for reflector structures present in the two tracks. A multistrip coupler structure is provided for the coupling of the tracks A, B, the multistrip coupler structure also having the offset $x_0$ with respect to the coupler strips.

It would be inherently possible (at least for two track arrangements having electrically coupled coupling transducers) to avoid acoustic crosstalk in that the two tracks of the surface wave arrangement are implemented on two individual substrates, i.e. on two substrates separated from one another. When arranged in only one common substrate, an acoustic crosstalk from one track into the other track can only be diminished in that these two tracks are arranged at a great distance from one another on this common substrate, i.e. a relatively large substrate is employed. However, these two possibilities, are not especially technologically meaningful.

The present invention has proceeded on the basis of the idea that the creation of the acoustic waves that lead to this acoustic crosstalk cannot be prevented, at least not in a simple way. The idea of the inventive solution is therefore based on the idea of eliminating an occurring acoustic crosstalk signal in that care is exercised to see that such a signal is compensated by an equal, opposite signal.

The realization of the idea of the present invention is in offsetting the sub-arrangement of one track and the sub-arrangement of the other track parallel thereto with respect to one another parallel to these tracks by such a geometrical dimension that substantial elimination of the two acoustic crosstalk signals is achieved, one thereof being generated in one track and the other thereof occurring in the other track and being converted into an electrical signal therein.

A rather critical advantage of the present invention is that the measure of the present invention has no influence on the surface wave structures, i.e. that this measure need not be taken into consideration in the production of the design of the respective surface wave arrangement. The present invention makes it possible to arrange the sub-arrangements of the two tracks in close juxtaposition on the common substrate, i.e. to be extremely frugal with the material of the substrate. Further, no measures are required in order to prevent the parasitic acoustic waves that are generated by the individual structures and produce the above-described crosstalk from being produced and/or propagated.

The inventively provided offset between these two tracks leads to the fact that a first acoustic crosstalk signal of a first structure of the first track and a second such signal of a second structure of what is again the first track are each independently acoustically received in the second track and converted into electrical signals such that the crosstalk signal of the first structure and that of the second structure of the first track are evaluated with opposite phase by the receivers in the second track and are thus eliminated. It is even advantageous for the present invention when the compulsory generation of the signals effecting the crosstalk is impeded as little as possible.

In addition to the main part of a wave excited by a surface transducer structure or reflected by a reflector structure that propagates in the principal wave propagation direction perpendicularly relative to the electrode or reflector strips, namely, there are wave parts that, running at an angle thereto, appear as parasitic signal parts in the surface of the substrate. The strength of such wave parts is dependent on the transducer geometry, on the propagation direction and on the anisotropy of the piezoelectric substrate material. Those wave parts are especially relevant that are beamed at a small angle relative to the principal wave propagation direction, i.e. that, given closely proximate tracks of the overall surface wave arrangement, proceed from one track in which they arose into the other track and are received therein as a parasitic signal.

The strength of such parasitic wave parts is in fact slight in relationship to the main signal part. The deterioration of the filter properties in the passband can thus usually be tolerated. In the stop band, however, this parasitic signal coupling deteriorates the selectivity capability to a rather considerable extent, this to be eliminated with the present invention in a technologically very simple way.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENT

Figure 1:
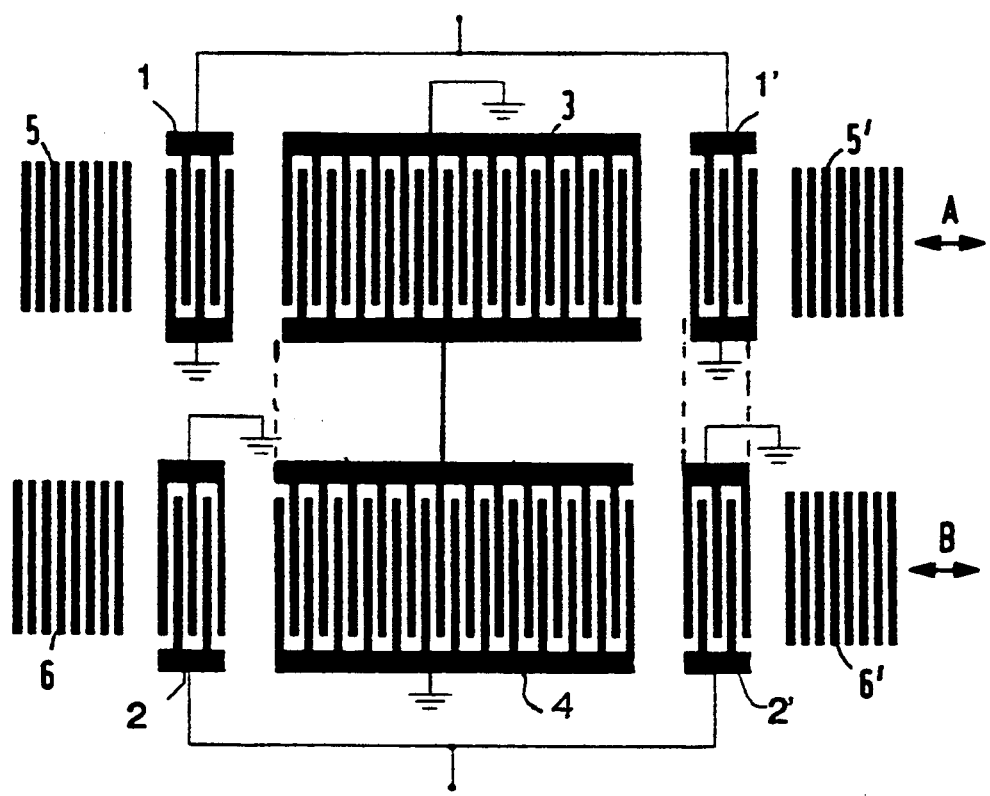
FIG. 1 is a diagram of a low-loss filter according to the present invention.

FIG. 1 shows a low-loss filter improved according to the present invention and having two input transducers 1 and 1' connected parallel to one another and having two output transducers 2 and 2' connected parallel to one another. The coupling transducers are referenced 3 and 4. Reflectors 5 and 5' or 6 and 6' that are allocated to the transducers turn the transducers into unidirectional transducers.

In FIG. 1, the two tracks A and B of the illustrated surface wave arrangements, i.e. their structures 1 through 6, are shown at a relatively large spacing from one another. In practice, the two tracks can be placed so closely to one another that, for example, the two busbars of the coupling transducers 3 and 4 lying opposite one another are a unit (lying at the same potential).

A parasitic acoustic connection between the transducer structure 1 of the track A and the transducers structure 2' of the track B is indicated by broken line d12'. This is a path of the acoustic crosstalk from the transducer 1 to the transducer 2'. A corresponding crosstalk is indicted by broken line d21'. The angle between the respective path of these two parasitic acoustic paths d12' and d21' and the track A or the track B is far smaller in practice than shown in FIG. 1, since the transducer structures 1, 1' of the track A and 2, 2' of the track B are usually far longer in comparison to the illustrated width. What the inventively provided offset of the transducer structures 2, 2' of the track B relative to those of the track A achieves is that the transmission paths d12' and d21' differ in length compared to one another by such a dimension that the parasitic signal of the transducer 1 and the parasitic signal of the transducer 1' generate electrical signals that are opposite in phase in the transducer 2' and the transducer 2 in the track B. These two, antiphase parasitic signals then mutually cancel in the reception transducers. A corresponding parasitic signal can also proceed from the reflector 5 of the track A into the reflector 6' of the track B. On the basis of an inventive, mutual offset of the reflectors 5, 5' of the track A on the one hand and 6, 6' of the track B on the other hand, the parasitic signal of the reflector 5 is cancelled by that parasitic signal that proceeds from the reflector 5' into the reflector 6.

The solution is achieved in the simplest possible way with the purely geometrical length offset shown in FIG. 1, namely in pairs for all structures of the track A on the one hand and all structures of the track B on the other hand.

A mathematical derivation directed to the present invention is provided below:

Without the present invention, it would derive that $d12' = d21'$ given a symmetrical arrangement of the structures of the two tracks A and B. The signals proceeding on these two paths in track 2 with the same amplitude and same phase superimpose thereat for the center frequency to form a signal $$S(f_0) = A_{12'}(-jk_0 d_{12'}) + A_{21'} \exp(-jk_0 d_{21'}) \text{ with} \qquad (1)$$

$$k0 = \frac{2\pi f_0}{v} = \frac{2p}{\lambda_0}, \qquad (2)$$

$A_{12'}$ and $A_{21'}$ therein are the amplitudes. The quantity $f_0$, $v$ and $\lambda_0 = v/f_0$ are the center frequencies of the filter, the speed of the acoustic wave and the acoustic wave length at the frequency $f_0$. The parasitic signal $S(f_0)$ becomes minimum when the two signals $A_{12'}$ and $A_{21'}$ arrive antiphase in the transducers 2 and 2'. This is the case when the condition $$k_0(d_{12'} - d_{21'}) = n\pi, \, n = \pm 1, \pm 3, \pm 5 \text{ etc.} \qquad (3)$$

is met. This leads to a compensation between the two signal amounts. The compensation is effective for the case of $n \pm 1$ for a maximum band width. What follows in this case is:

$$|d_{12'} - d_{21'}| = \frac{\lambda_0}{2};$$

Figure 2:
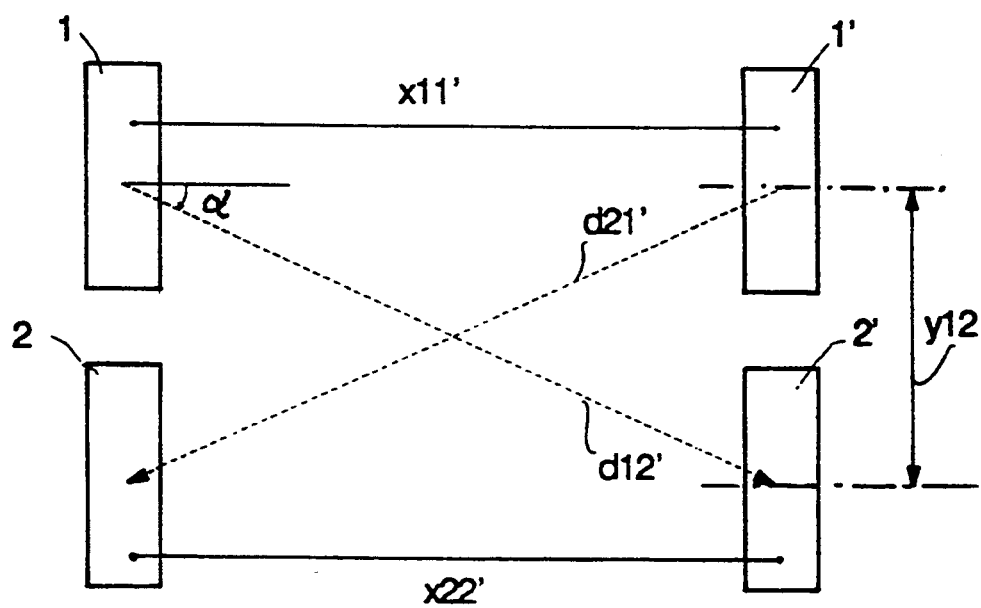
FIG. 2 depicts the effect of crosstalk in the FIG. 1 filter.

The quantity $\lambda_0$ is the wavelength given a propagation direction at the angle $\alpha$ and, due to the substrate anisotropy, is generally slightly different from the wavelength of the principal propagation direction $\alpha = 0$. The relative spacings $x_{11'}$ and $x_{22'}$ (see FIG. 2) are selected under points of view of the filter design. The aforementioned compensation is possible by a displacement of the two track arrangements relative to one another by $x_0$ in x-direction. This displacement is dependent on the track spacing $y_{12}$ as well as on the transducer spacings $x_{11'}$ and $x_{22'}$ and can be calculated from the following equation:

$$|[(x_{11'} - x_0)^2 + (y_{12})^2]^{\frac{1}{2}} - [(x_{22'} + x_0)^2 + (y_{12})^2]^{\frac{1}{2}}| = (2N - 1) \frac{\lambda_0}{2} \quad (5)$$

wherein N is a (small) whole number, preferably N=1. The band width for the compensation of the two parasitic signals amounts to 50%.

When the displacement $x_0$ is dimensioned according to equation (5), then the tracks can be arranged arbitrarily close to one another. The chip area can thus be considerably minimized. In resonators wherein mode coupling effects are to be avoided, a smaller aperture can now be additionally selected. In the special instance of $x_{11'} = x_{22'}$ and $y_{12} << x_{11'}$ that frequently occurs in resonator filters in narrow-band low-loss filters, the above equation can be simplified. What is then valid for the displacement $x_0$ is:

$$x_0 = \frac{\lambda_0}{4} \text{ or } x_0 = (2N - 1) \cdot \frac{\lambda_0}{4}$$

Figure 3:
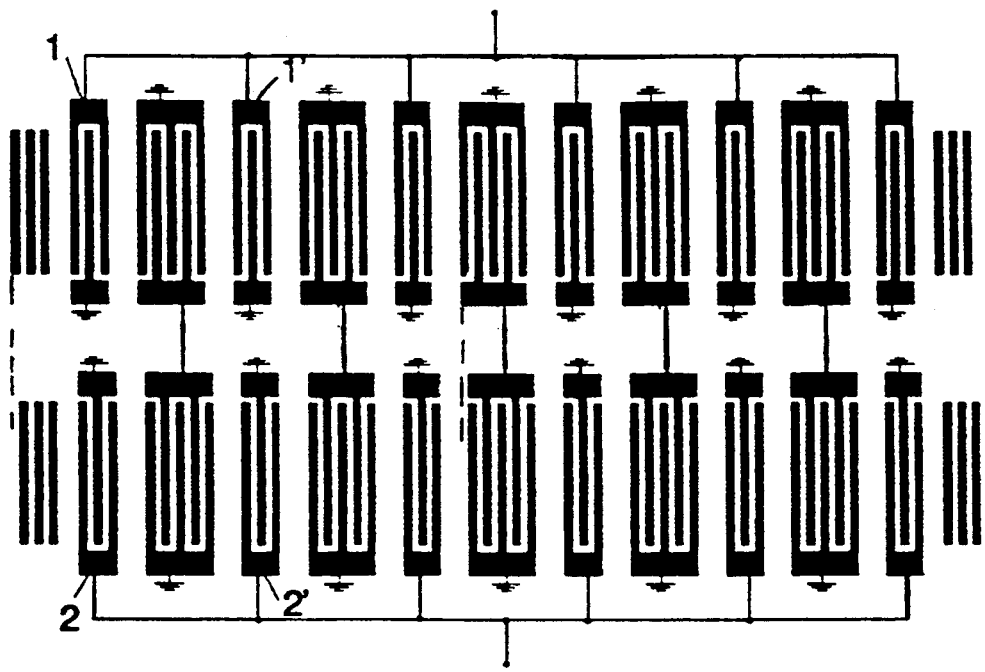
FIG. 3 is a diagram of a filter of the present invention with multiple transducer surface wave arrangements.

FIG. 3 shows an exemplary embodiment of the invention wherein the two tracks contain multiple transducer surface wave arrangements. In general, such surface wave arrangements are well known. The two tracks are electrically coupled to one another via the coupling transducers. The arrangement of the one track is the input side and the arrangement of the other track is the appertaining output side. According to the present invention, the surface wave arrangement of the second track is displaced toward the right (or toward the left) relative to the surface wave arrangement of the first track by the dimension $x_0$ deriving from equation 5 or, potentially, also from equation 6. A displacement by an uneven-numbered, low multiple of the quarter wavelength can also be implemented instead of the dimension deriving from equations 5 and 6.

Figure 4:
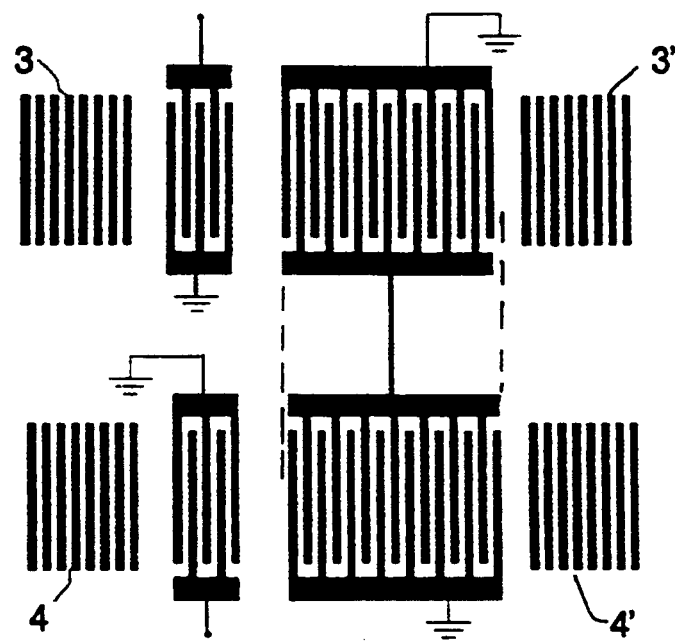
FIG. 4 is a diagram of the filter of the present invention with multiple transducer surface waves.

FIG. 4 shows another example with their displacement of the arrangements of the tracks relative to one another dimensioned again according to equation 5.

Figure 5:
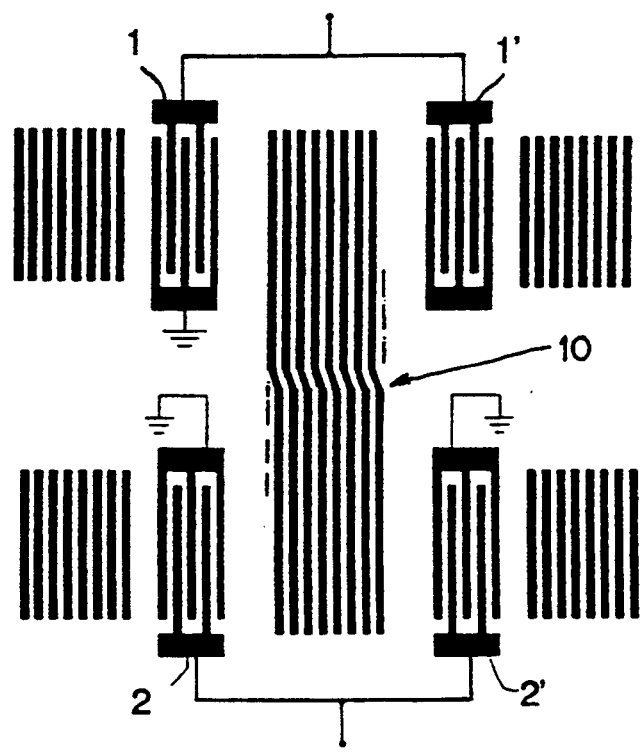
FIG. 5 is a diagram of the filter of the present invention with a multistrip coupler.

FIG. 5 shows an arrangement having a coupling of the tracks to one another effected with a multistrip coupler 10 instead of with electrical coupling. The offset of the strips of the multistrip coupler may be seen at the multistrip coupler 10, this offset necessarily deriving from the displacement of the arrangements of the tracks relative to one another. The arrangement of FIG. 5 with a multistrip coupler 10 roughly corresponds to that of FIG. 1 having the coupling transducers 3 and 4.

Figure 6:
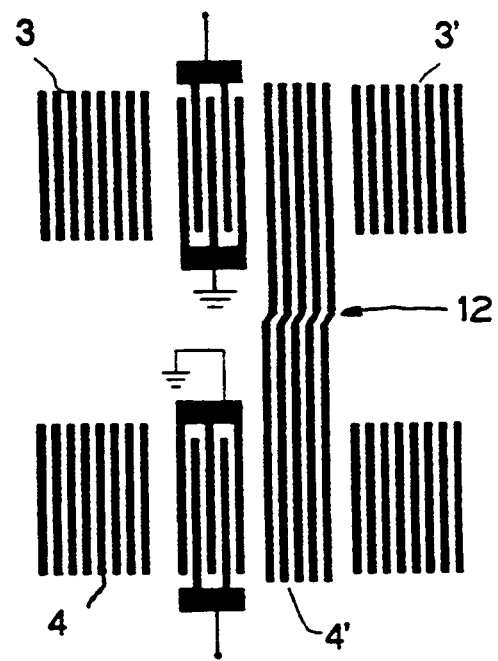
FIG. 6 is a diagram of the filter of the present invention with another multistrip coupler.

FIG. 6 shows another embodiment with a multistrip coupler 12.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A two track surface wave arrangement, whereby 2N transducer structures, N being a whole number, belonging to an input side are present in a first track in a predetermined geometrical arrangement relative to one another and whereby 2N transducer structures, N being a whole number, belonging to an output side are arranged in a second track, whereby each of the transducer structures of the input and output sides has a reference plane, the arrangement having coupling of the first and second tracks, comprising: a first arrangement having transducer structures of the first track and a second arrangement having transducer structures of the second track positioned, said first and second arrangements being offset relative to one another parallel to a direction of the first and second tracks and being positioned offset by a dimension $x_0$ according to $$|[(x_{11'} - x_0)^2 + (y_{12})^2]^{\frac{1}{2}} - [(x_{22'} + x_0)^2 + (y_{12})^2]^{\frac{1}{2}}| = \frac{\lambda_0}{2}$$

$$\text{or } = (2N - 1) \frac{\lambda_0}{2}$$

where:

$x_{11'}$ and $x_{22'}$ are respective spacings of the transducer structures of the first and second tracks from one another, $y_{12}$ is a spacing of the first and second tracks from one another, and $\lambda_0$ is the wavelength of a center frequency of a signal in substrate material of the two track surface wave arrangement.

2. The arrangement according to claim 1, wherein each of the first and second tracks have reflector structures and wherein the reflector structures in the first and second tracks also have an offset of $x_0$ relative to one another.

3. The arrangement according to claim 1, wherein the arrangement further comprises a multistrip coupler structure having coupler strips for the coupling of the first and second tracks, said multistrip coupler structure also having the offset of $x_0$ with respect to the coupler strips thereof.

4. A two track surface wave arrangement having 2N transducer structures, N being a whole number, of an input side being in a first track in a predetermined geometrical arrangement relative to one another and 2N transducer structures, N being a whole number, of an output side being in a second track, each of the transducer structures of the input and output sides having a reference plane, the arrangement having coupling of the first and second tracks, comprising: a first arrangement having transducer structures of the first track and a second arrangement having transducer structures of the second track positioned, said first and second arrangements being offset relative to one another parallel to a direction of the first and second tracks and being positioned offset by a dimension $x_0$ according to $$|[(x_{11'} - x_0)^2 + (y_{12})^2]^{\frac{1}{2}} - [(x_{22'} + x_0)^2 + (y_{12})^2]^{\frac{1}{2}}| = \frac{\lambda_0}{2};$$

$$\text{or } = (2N - 1) \frac{\lambda_0}{2}$$

where:

$x_{11'}$ and $x_{22'}$ are respective spacings of the transducer structures of the first and second tracks from one another, $y_{12}$ is a spacing of the first and second tracks from one another, and $\lambda_0$ is the wavelength of a center frequency of a signal in substrate material of the two track surface wave arrangement;

and reflector structures in each of said first and second tracks also having the offset of $x_0$ relative to one another.

5. The arrangement according to claim 4, wherein the arrangement further comprises a multistrip coupler structure having coupler strips for the coupling of the first and second tracks, said multistrip coupler structure also having the offset of $x_0$ with respect to the coupler strips thereof.

6. A two track surface wave arrangement having an input side and an output side, the input side having 2N transducer structures, N being a whole number, in a first track in a predetermined geometrical arrangement relative to one another and the output side having 2N transducer structures, N being a whole number, in a second track, comprising: a first arrangement having transducer structures of the first track and a second arrangement having transducer structures of the second track positioned, said first and second arrangements being offset relative to one another parallel to a direction of the first and second tracks and being positioned offset by a dimension $x_0$ according to $$|[(x_{11'} - x_0)^2 + (y_{12})^2]^{\frac{1}{2}} - [(x_{22'} + x_0)^2 + (y_{12})^2]^{\frac{1}{2}}| = \frac{\lambda_0}{2};$$

$$\text{or} = (2N - 1)\frac{\lambda_0}{2}$$

where:

$x_{11'}$ and $x_{22'}$ are respective spacings of the transducer structures of the first and second tracks from one another, $y_{12}$ is a spacing of the first and second tracks from one another, and $\lambda_0$ is the wavelength of a center frequency of a signal in substrate material of the two track surface wave arrangement; reflector structures in each of said first and second tracks having the offset of $x_0$ relative to one another; and a multistrip coupler structure for coupling of the first and second tracks, said multistrip coupler structure having the offset of $x_0$ with respect to coupler strips thereof.

* * * * *